United States Patent [19]

Muranaka et al.

[11] Patent Number: 4,849,939
[45] Date of Patent: Jul. 18, 1989

[54] SEMICONDUCTOR MEMORIZING DEVICE

[75] Inventors: Masaya Muranaka, Akishima; Hiromi Matsuura, Tokorozawa; Kanehide Kenmizaki, Kodaira; Osamu Okayama, Tokyo, all of Japan

[73] Assignees: Hitachi, Ltd.; Hitachi VLSI Engineering Corp., both of Tokyo, Japan

[21] Appl. No.: 100,752

[22] Filed: Sep. 24, 1987

[30] Foreign Application Priority Data

Sep. 24, 1986 [JP] Japan .................................. 61-223579

[51] Int. Cl.$^4$ ............................................... G11C 11/40
[52] U.S. Cl. ................................ 365/200; 365/230.01; 365/201; 371/10
[58] Field of Search ............... 365/200, 210, 189, 201, 365/230; 371/10

[56] References Cited

U.S. PATENT DOCUMENTS 4,556,975 12/1985 Smith et al. ............................ 371/10
4,567,580 1/1986 Varshney ............................ 365/200

OTHER PUBLICATIONS

"Nikkei Electronics", published by Nikkei McGraw-Hill, Jun. 3, 1985, pp. 209-231.

Primary Examiner—Joseph A. Popek
Attorney, Agent, or Firm—Antonelli, Terry & Wands

[57] ABSTRACT

A semiconductor memory having a memory array, a first and a second selection line which are connected to a memory cell, and a selection means which selects either one of the selection lines. The selection means includes a selection circuit which optionally selects the first selection line or the second selection line when an address signal corresponding to the first selection line is aligned with a predetermined address signal.

23 Claims, 7 Drawing Sheets

SEMICONDUCTOR MEMORIZING DEVICE

BACKGROUND OF THE INVENTION

This invention relates generally to a semiconductor memory, and more particularly relates to an arrangement which is advantageous for use in a dynamic type RAM (Random Access Memory) which contains a stand-by memory array.

In semiconductor memories such as dynamic type RAMS and so on a stand-by memory array can be prepared ahead of time in the memory array. The stand-by memory acts to be shifted as an alternative to a word line or a data line in which a defective memory cell is detected within the memory array. Thus, an operation which can be called a defective bit relief is carried out for the purpose of keeping a high product yield. In order to achieve this object, a redundant address switching circuit is provided which memorizes the defective address, compares this defective address with an address signal which is supplied from outside at the time of memory accessing, and switches the defective address for an address in the stand-by memory array when this defective address is assigned.

A dynamic type RAM containing such a redundant address switching circuit is, for example, shown at P.P 209 to P.P 231, "Nikkei Electronics", issued on June 3, 1985, published by Nikkei McGraw-Hill.

One address comparison type device is an arrangement in which a comparison address is provided by way of whether the fuse of an address comparison circuit having a programming element such as a fuse is melted or not. The provided comparison address and an input address are compared with each other so as to form a redundant address switching signal. Such an arrangement has been conventionally used (e.g., see P. 239 to P. 245, No. 239 Edition, "Nikkei Electronics", issued on Feb. 7, 1981, published by Nikkei McGraw-Hill).

In such a dynamic type RAM having the above redundant address switching circuit, a defective memory cell is detected at the time of checking products, and the address of the word line or a data line to which the defective memory cell is connected is registered in a ROM (Read Only Memory) of the redundant address switching circuit. When this defective address is then assigned, an address aligning signal of an address comparison circuit which is contained in the redundant address switching circuit is output, and switching for the corresponding stand-by memory array is thus carried out. An address roll mechanism is used which outputs an address aligning signal of the address comparison circuits which respectively corresponds to each stand-by memory array. The address aligning signal is provided to the outer terminal so as to identify a row address or a column address of the word line or a data line to which the defective memory cell is connected.

SUMMARY OF THE INVENTION

However, the inventors of the present invention made it clear that although the above address roll mechanism can identify the row address or the column address of the word line or the data line to which the defective memory cell is connected, it cannot identify the address of the defective memory cell as a bit unit. Further, the contents of the defect by way of accessing the defective memory cell cannot be examined and the address cannot be identified in a bit unit because the switching function by means of the redundant address switching circuit to the stand-by memory array is carried out unconditionally only when the defective address is registered. Consequently, statistical research of the state where defects occur in a dynamic type RAM or analysis on the contents of the defect cannot be carried out with a fail bit map (Fail Bit Map) and so forth processed after a product has been completed.

An object of the present invention is to provide a semiconductor memory which is capable of controlling function switching to the stand-by memory array.

The above and further objects and novel features of the invention will be apparent from the specification and the accompanying drawings.

An outline of the typical feature of the present invention will now be briefly explained. That is, a defective address and an address which is assigned from outside are compared with each other, and a function of a redundant address switching circuit which switches to a stand-by memory array is arranged to be selectively prohibited in accordance with a predetermined control signal which is supplied from outside in the case where the above two addresses are coincident.

According to the above means, since the switching to the stand-by memory array can be selectively prohibited, and the defective memory cell can be intentionally accessed in accordance with the control signal which is supplied from outside even after a product has been completed, the address of the defective memory cell and the contents of the defect can be identified, as a result of which, statistical research on the state where a defect occurs in a semiconductor memory and an analysis on the defects can be easily carried out.

DESCRIPTION OF THE PREFERRED EMBODIMENTS

Figure 2:
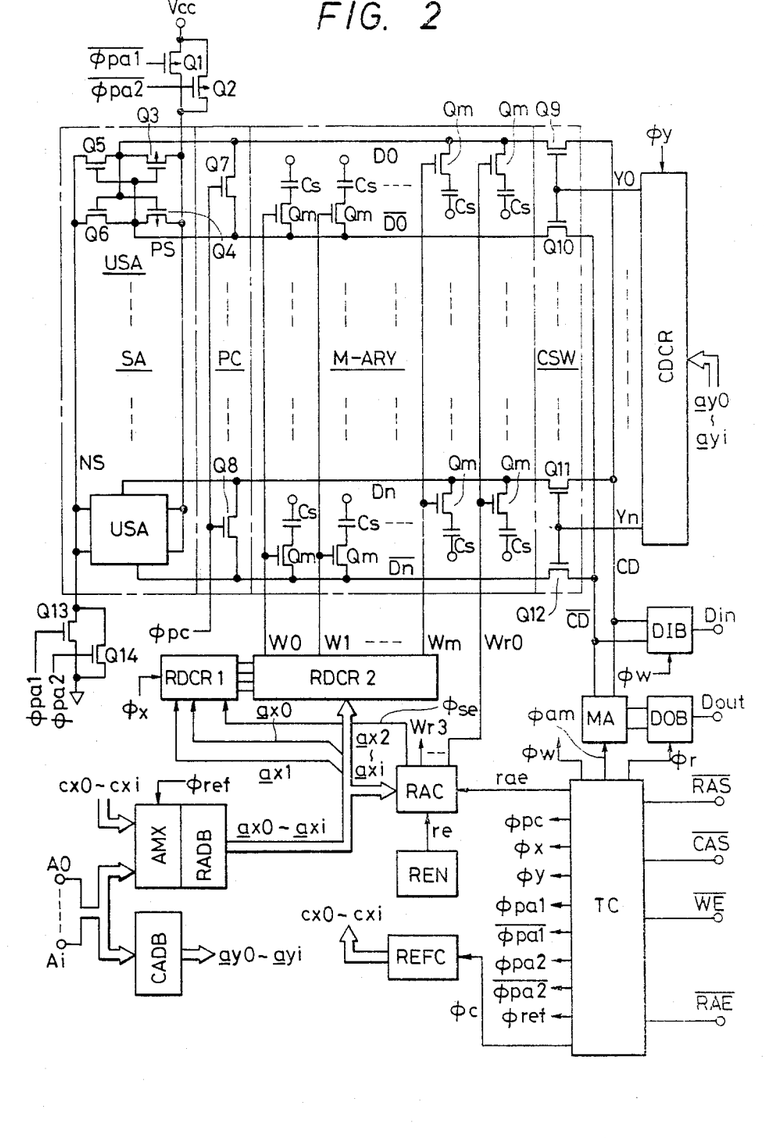
FIG. 2 is a block diagram illustrating one embodiment of the dynamic type RAM containing the redundant address switching circuit in FIG. 1.

FIG. 2 is a block diagram illustrating one embodiment of a dynamic type RAM to which this invention is applied. Each circuit element in this diagram is manufactured in a known manner for a CMOS (Complementary MOS) integrated circuit, and, although not especially specified, can be formed on a semiconductor substrate such as a monocrystal silicon. The channel portion (back gate) of a MOSFET marked with an arrow shows the P-channel type. On the other hand, no mark shows an N-channel MOSFET.

The dynamic type RAM in this embodiment, not especially specified, is provided with four stand-by word lines Wr0 to Wr3. These stand-by word lines are selected and assigned by means of a redundant address switching circuit RAC. The redundant address switching circuit RAC is arranged to be in a selectively actuated state in accordance with an inner controlling signal rae which is formed by a redundant address enable signal RAE which is supplied as a controlling signal from outside in a timing controlling circuit TC. As a result of this, the function of the redundant address switching circuit RAC can be prohibited by means of this controlling signal even after the dynamic type RAM has been completed, and a defective memory cell can be intentionally accessed.

Furthermore, the dynamic type RAM in this embodiment is provided with a redundant enable circuit REN which memorizes a registration of a defective address of a defective memory cell detected in the dynamic type RAM. An inner controlling signal re which is obtained as an output signal from this redundant enable circuit REN controls the address comparison function of the redundant address switching circuit RAC. As a result of this, when no defective memory cells are detected in the dynamic type RAM, and no defective address are registered, switching of a certain address for a stand-by memory array can be prevented because a ROM for memorizing a defective address is in an initial state (for example: address "0"). The inner controlling signal re is used to adjust the timing of forming the inner timing signal in accordance with presence/non-presence of a defective memory cell after the inner signal re has been supplied to a timing controlling circuit TC through a signal passage omitted from illustration.

Furthermore, an address multiplex method is employed in this dynamic type RAM in this embodiment, in which X-address signals AX0 to AXi and Y-address signals AY0 to AYi are supplied through corresponding outer terminals A0 to Ai. And a refresh address counter REFC which assigns a word line which is to be refreshed in an automatic refresh function mode and an address multiplexer AMX which switches and selects a refresh address signals cx0 to cxi which are generated by the above refresh address counter REFC and the X-address signals AX0 to AXi which are supplied from outside so as to conduct to a row address buffer RADB are provided.

A memory array M-ARY in FIG. 2, although not especially specified, can be designed to be formed by a two intersection arrangement which includes $n+1$ sets of complementing data lines D0·$\overline{D0}$ to Dn·$\overline{Dn}$ which are horizontally arranged in FIG. 2 and $m+1$ sets of word lines W0 to Wm which are vertically arranged in the same and four stand-by word lines Wr0 to Wr3 which act to relieve defective bits. A plurality of memory cells $(m+5) \times (n+1)$ are arranged in a lattice form at the intersections between the above complementing data lines and word lines. MOSFET Qm for address selection and $m+5$ pieces of memory cells which comprises an information memorizing capacitor Cs are connected to the respective complementing data lines according to a predetermined regulation as typically represented by the complementing data lines D0·$\overline{D0}$ and Dn·$\overline{Dn}$.

A precharge circuit PC consisting of switch MOSFETS which are represented by MOSFETS Q7 and Q8 is provided between a non-inversion signal line and an inversion signal line of each complementing data line. Gates of these switch MOSFETS are connected collectively for the purpose of being supplied with a timing signal $\phi$ pc from a timing controlling circuit TC to be described hereinafter. This timing signal $\phi$pc is arranged to be high level when the dynamic type RAM is not actuated, and to be low level when it is actuated. As a result switch MOSFETS Q7 and Q8 are turned on when the dynamic type RAM is in the non-actuated state in which the timing signal $\phi$pc is high level, and two signal lines of the complementing data line are short cut so as to provide a half-precharge level such as substantially half the power source voltage Vcc. The level of two signal lines of complementing data lines is modified from a half-precharge level to a high level or a low level, as a result of which the read-out speed is increased.

A sense amplifier SA consists of plurality of unit circuits USA $n+1$. Each unit circuit USA is formed by a CMOS latch circuit which consists of P-channel MOSFETS Q3, Q4 and N-channel MOSFETS Q5, Q6 as exemplified in FIG. 2. Each input/output node of the above latch circuit is connected to corresponding complementing data lines D0·$\overline{D0}$ to Dn·$\overline{Dn}$. Power supply voltage Vcc is supplied to the unit circuit of the above sense amplifier SA through P-channel MOSFETS Q1 and Q2, while a grounding voltage for the circuit is supplied through the N-channel MOSFETS Q13 and Q14 arranged in the parallel manner. These driving MOSFETS Q1 and Q2 and MOSFETS Q13 and Q14 are commonly used in unit circuits which are provided in one memory mat. Namely, sources for P-channel MOSFETS Q1 and Q2 and N-channel MOSFET Q13 and Q14 which consist of a sense amplifier unit circuit USA which is contained in one memory mat are commonly connected to common source lines PS and NS.

Complementing timing signals $\phi$pa1 and $\overline{\phi\text{pa1}}$ which are adapted to actuate the sense amplifier SA are spliced to gates of the above MOSFETS Q1 and Q13, and complementing timing signals $\phi$pa2 and $\overline{\phi\text{pa2}}$ which are formed slightly later than forming of the above timing signals $\phi$pa1 and $\overline{\phi\text{pa1}}$ are supplied to the gates of MOSFETS Q2 and Q14. As a result of this, the function of the sense amplifier SA is carried out in two steps. That is, in the first step in which the timing signals $\phi$pa1 and $\overline{\phi\text{pa1}}$ are supplied, MOSFETS Q1 and Q13 which are adapted to have a relatively small conductance are turned on, and, as a result of their current restriction function, a small read out voltage which is supplied to a complementing data line from a corresponding memory cell is amplified without any undesired level modification. After the potential difference between complementing data lines has been increased up to a certain level because of the amplifying of the above sense amplifier SA, the timing signals $\phi$pa2 and $\overline{\phi\text{pa2}}$ are supplied. The MOSFETS Q2 and Q14 having a relatively large conductance are therefore turned on. The amplifying function of the sense amplifier Sa is made faster when the MOSFETS Q2 and Q14 are turned on, and the level of the complementing data line shifts rapidly to the high level or to the low level. As mentioned above, carrying out the amplifying functions of the sense amplifier SA in two steps can prevent an undesired level modification of the complementing data line, and further data can be read out at high speed.

The complementing data line is connected to a switch MOSFET which forms a column switch CSW on the side opposite to the above sense amplifier SA. The column switch CSW is, as represented by MOSFETS Q9 and Q10, Q11 and Q12, formed of a plurality of pairs of MOSFETS n+1, which selectively connect the assigned complementing data line and common complementing data line CD·$\overline{CD}$. Gates of the switches of a pair of MOSFETS Q9·Q10 to Q11·Q12 are commonly connected, and data line selection signals Y0 to Yn which are formed by column decoder CDCR are supplied.

On the other hand, gates of address selection MOSFETS Qm of memory cells which are arranged in one row of the memory array M-ARY are respectively connected to corresponding word lines W0 to Wm or stand-by word lines Wr0 to Wr3. The word lines W0 to Wm are connected to a row address decoder, and one of these word lines is selected and assigned. The stand-by word lines Wr0 to Wr3 are selected and assigned by the hereinafter described redundant address switching circuit RAC.

Although not especially specified, the row address decoder can be formed with a two step structure consisting of a primary row address decoder RDCR1 and a second row address decoder RDCR2. The primary row address decoder RDCR1 decodes complementing inner address signals ax0 and ax1 of lower two bits (for example: the combination of the inner address signal ax0 which is of a same phase as that of the outer address signal AX0 and the inner address $\overline{ax0}$ of a inverse phase is represented by complementing inner address signal ax0, to be similar hereinafter), and form four word line selection timing signals $\phi$x00 or $\phi$x11 which are synchronized with a timing signal $\phi$x which is supplied from the timing controlling circuit TC. These word selection timing signals form a word line selection signal (W0 to Wm) which acts to select a word line which is assigned to the X-address signals AX0 to AXi by way of combination with a common selection signal which is formed by the second row address decoder which decodes the complementing inner address signals ax2 to axi except for the lower two bits. The selection function of the primary row address decoder RDCR1 is prohibited by a high level timing signal $\phi$se which is formed by the redundant switching circuit RAC when the address which is assigned from outside is aligned with the defective address.

Thanks to forming the selection circuit of the row address system in the above two step manner, the layout pitch (interval) of the unit circuits of the second row address decoder RDCR2 and that of the word line can be aligned, and layout on the substrate of a semiconductor can be efficiently designed.

A row address buffer RADB receives a row address signal which is supplied from an address multiplexer AMX, and keeps it, and forms complementing inner address signals ax0 to axi for the purpose of supplying it to the primary row address decoder RDCR1, second row address decoder RDCR2 and the redundant address switching circuit RAC.

As hereinbefore described, the automatic refresh mode which is adapted to read out and re-write memorized data of the memory cell is provided for the dynamic type RAM in this embodiment, and a refresh address counter REFC acts to assign the word line to be refreshed in the automatic refresh mode. An address multiplexer AMX selects X-address signals AX0 to AXi which are supplied by an outer device through outer terminals A0 to Ai in the normal memory access mode in which the timing signal $\phi$ref which is supplied from the timing controlling circuit TC is at a low level, and conducts it to the row address buffer RADB. And it selects refresh address signals cx0 to cxi which are output by refresh address counter REFC in the automatic refresh mode in which the timing signal $\phi$ref is at a high level.

Since the x-address signals AX0 to AXi are supplied in synchronization with the last transition of a row address strobe signal $\overline{RAS}$ which is supplied from outside as a controlling signal, inletting the row address signal by means of the row address buffer RADB is carried out in accordance with a timing signal $\phi$ar which is formed by way of detection of the last transition of the row address strobe signal $\overline{RAS}$ by means of the timing controlling circuit TC.

The refresh address counter REFC is operated in the automatic refresh function mode of the dynamic type RAM, and counts a timing signal $\phi$c which is supplied by the timing controlling circuit TC, and forms refresh address signals cx0 to cxi which act to assign the word line to be refreshed, and supplies it to an address multiplexer AMX.

A column address buffer CADB inlets the Y-address signals AY0 to AYi which are supplied through the address signal input terminals A0 to Ai in synchronization with the last transition of the column address strobe signal $\overline{CAS}$ by means of a timing signal $\phi$ac which is formed by way of detecting the last transition of the column address strobe signal $\overline{CAS}$ in the timing controlling circuit TC. The column address buffer CADB forms complementing inner address signals ay0 to ayi by means of these Y-address signals AY0 to AYi, and supplies them to a column address decoder.

The column address decoder CDCR decodes the complementing address signals ay0 to ayi which are supplied by the above column address buffer CADB, and forms data selection signals Y0 to Yn in accordance with data line selection timing signal $\phi$, and supplies them to the column switch CSW.

The common complementing data line CD·$\overline{CD}$ to which the complementing data line which has been assigned by the column switch CSW is selectively connected to an input terminal of a main amplifier MA, and is also connected to an output terminal of a data input buffer DIB. The output terminal of the main amplifier MA is further connected to an input terminal of a data output buffer DOB.

The main amplifier MA is actuated by the high level of a timing signal $\phi$ma which is supplied by the timing controlling circuit TC, and further amplifies read out data from the selected memory cell through the complementing common data line CD·$\overline{CD}$, and conducts it to the data output buffer DOB.

The data output buffer DOB is brought into an actuated state by means of a timing signal $\phi$r which is supplied by the timing controlling circuit TC in the read-out function mode of the dynamic type RAM, and outputs an output signal of the above main amplifier MA to a data output terminal Dout. The output of the data output buffer DOB is set to be of high impedance in the non-actuated state or the writing function mode of the dynamic type RAM.

A data input buffer DIB is brought into an actuated state by means of the high level of the timing signal φw which is supplied from the timing controlling circuit TC in the writing function mode of the dynamic type RAM, and supplies writing data which is supplied from a data input terminal Din as a complementing writing signal to the complementing common data line CD·$\overline{CD}$. The output from the data input buffer DIB is set to be a high impedance state in the non-actuated state or the read out function mode of the dynamic type RAM.

The main components of an redundant address switching circuit RAC are, as hereinafter described with regard to FIG. 1, defective address memory circuits ROM0 to ROM3 which are respectively provided in accordance with the stand-by word lines Wr0 to Wr3, address comparison circuits AC0 to AC3 and stand-by word line driving circuits RWD0 to RWD3 which act to drive corresponding stand-by word lines in accordance with the output signal from the above address comparison circuit.

Address comparison circuits AC0 to AC3 of the redundant address switching circuit RAC are brought into the actuated state by the high level of the inner controlling signal re which is supplied by a redundant enable circuit REN, and compare in each stand-by word line the defective addresses which are registered in the corresponding defective address memorizing circuits ROM0 to ROM3 with the complementing inner address signals $\underline{a}x0$ to $\underline{a}xi$ which are supplied from the address multiplexer A$\overline{M}$X at each bit. If two addresses are aligned over all bits, the output signal of the address comparison circuits AC0 to AC3 become high level, as a result of which the corresponding stand-by word lines Wr0 to Wr3 are brought into a selection state by means of the stand-by word line driving circuits RWD0 to RWD3. If any one of four stand-by word lines is brought into the selection state, the timing signal φse is brought into high level, as a result of which the selection function of the primary row address decoder RDCR1 is prohibited.

Detailed structure and the function of the redundant address switching circuit RAC will be described hereinafter.

The redundant enable circuit REN is formed by a memory circuit with a fuse means and a flip-flop which is arranged to be set by means of the output signal from this memory circuit. The fuse means which forms the redundant enable circuit REN is automatically cut when the defective address is written in one address memory circuit of the above redundant address switching circuit RAC. As a result of this, the memory circuit of the redundant enable circuit REN is adapted to memorize that the defective memory cell is detected in the memory array of the dynamic type RAM, and the defective address is registered in the redundant address switching circuit RAC. By way of cutting the fuse means, the flip-flop of the redundant enable circuit REN is brought into a set state. The output signal of the flip-flop is conducted as a inner controlling signal re to the redundant address switching circuit RAC and the timing controlling circuit TC.

The timing controlling circuit TC forms the variable timing signals and an inner controlling signal by means of the row address strobe signal $\overline{RAS}$, column address strobe signal $\overline{CAS}$, write enable signal $\overline{WE}$ and redundant address enable signal $\overline{RAE}$ which are supplied from outside as a controlling signal, and supplies it to respective circuits. Some of the above timing signals are formed in the time delay manner by way of bringing the inner controlling signal re which is supplied from the above redundant enable circuit REN into a high level. In the case where the inner controlling signal re is at a low level, that is, the defective memory cell is not detected in the memory array of the dynamic type RAM, the timing signal is formed without any time delay, and speed of the function is thus made increase.

Figure 1:
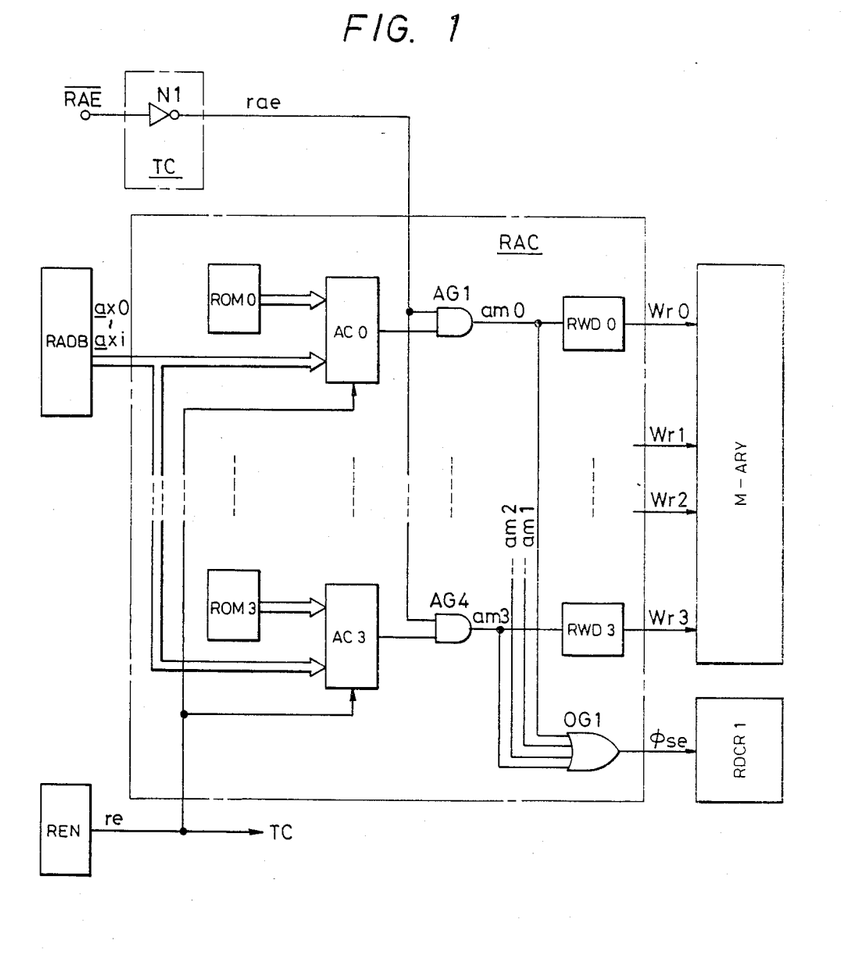
FIG. 1 is a circuit block diagram illustrating one embodiment of a redundant address switching circuit of a dynamic type RAM to which the present invention is applied.

FIG. 1 is a circuit block diagram illustrating one embodiment of the redundant address switching circuit RAC of the dynamic type RAM in accordance with the present invention.

In FIG. 1, main components of the redundant address switching circuit RAC are defective address memory circuits ROM0 to ROM3 which are provided in accordance with four stand-by word lines Wr0 to Wr3, address comparison circuits AC0 to AC3 and stand-by word line driving circuits RWD0 to RWD3.

The defective address memory circuits ROM0 to ROM3 are formed by a memory element of i+1 bit which is provided in accordance with corresponding complementing inner address signals $\underline{a}x0$ to $\underline{a}xi$. These memory elements are, for example, formed by fuse means which can be cut electrically. In the initial state in which this fuse means has not been cut, output signals corresponding to each ROM are at a low level. In the case where a defective memory cell is detected in the wafer test of the dynamic type RAM, fuse current is supplied through a cutting pad, which is omitted from illustration, to the memory element which corresponds to be bit of a logic "1" in the address of the word line to which the defective memory cell is connected, as a result of which the fuse means is cut. Consequently, an output signal of the ROM corresponding the memory element is brought into the high level.

The output signals of the defective address memory circuits ROM0 to ROM 3 are respectively supplied to one input terminal of the bit of the corresponding address comparison circuits AC0 to AC3. Complementing inner address signals $\underline{a}x0$ to $\underline{a}xi$ are respectively supplied from the row address buffer RADB to the other input terminal of each bit of the corresponding address comparison circuits AC0 to AC3. And the inner controlling signal re is supplied to the address comparison circuits AC0 to AC3 from the redundant enable circuit REN.

The address comparison circuits AC0 to AC3 compare the defective address which is supplied from the defective address memory circuits ROM0 to ROM3 and the complementing inner address signals ax0 to axi which are commonly supplied by the raw address buffer RADB at each bit. The output signal from the address comparison circuits AC0 to AC3 are usually brought into a low level, and if two addresses are aligned over all bits, the output signal is brought into a high level.

The output signals of the address comparison circuits AC0 to AC3 are respectively supplied to one side input terminal of the corresponding AND gate circuits AG1 to AG4. An inner controlling signal rae is commonly supplied from the timing controlling circuit TC to the other side input terminal of the above AND gate circuits AG1 to AG4.

The inner controlling signal rae, which is not especially specified, can be formed by way of inversion of the redundant address enable signal $\overline{RAE}$ which is supplied as a controlling signal from outside in the timing controlling circuit TC by means of an inverter circuit N1. The redundant address enable signal $\overline{RAE}$ is brought into the low level in the case where the switching by the redundant address switching circuit RAC to the stand-by memory array is carried out, and when this switching function is prohibitted, it is brought into the high level.

As a result of this, the output signals am0 to am3 from the AND gate circuits AG1 to AG4 are brought into the high level when the inner controlling signal rae is at the high level, that is, the redundant address enable signal $\overline{RAE}$ is at a low level in the case where the output signal from the corresponding address comparison circuits AC0 to AC3 is at a high level. In other words, the defective address and the address which is assigned from outside are aligned with each other.

The output signals am0 to am3 from the AND gate circuits AG1 to AG4 are respectively supplied to corresponding stand-by word line driving circuits RWD0 to RWD3, and also supplied to the first to fourth input terminals of the OR gate circuits OG1.

The stand-by word line driving circuits RWD0 to RWD3 bring corresponding stand-by word lines Wr0 to Wr3 into the selection state in accordance with the output signals am0 to am3 from the corresponding AND gate circuits AG1 to AG4. Namely, when the output signals am0 to am3 of the corresponding AND gate circuits AG1 to AG4 are brought into high level, the stand-by word line driving circuits RWD0 to RWD3 bring the corresponding stand-by word line Wr0 to Wr3 into high level. In the case where the output signal am0 to am3 of the corresponding AND gate circuit AG1 to AG4 is in the low level, the stand-by word lines Wr0 to Wr3 are brought into a non-selection state of low level. And the redundant address enable signal $\overline{RAE}$ which is supplied from outside is brought into high level, and the inner controlling signal rae is brought into low level, the output signals am0 to am3 from the AND gate circuits AG1 to AG4 are brought into low level without any concern to the result of the address comparison carried out by means of the address comparison circuits AC0 to AC3. As a result of this, the function switching to the stand-by memory array by means of the redundant address switching circuit RAC is prohibited.

The output signals am0 to am3 from the AND gate circuit AG1 to AG4 are supplied to the first to fourth input terminals of the OR gate circuit OG1, and the output signal is supplied as a timing signal $\phi$se to the first row address decoder RDCR1. The output signal of the OR gate circuit OG1, that is the timing signal $\phi$se, is brought into high level when either one of the output signals am0 to am3 of the AND gate circuits AG1 to AG4 is brought into high level, and either one of the stand-by word lines Wr0 to Wr3 is brought into a selection state. This high level of the timing signal $\phi$se acts to prohibit the selection function of the word line carried out by means of the first row address decoder RDCR1, and as a result of this switching to the stand-by word lines Wr0 to Wr3 is carried out.

Figure 3:
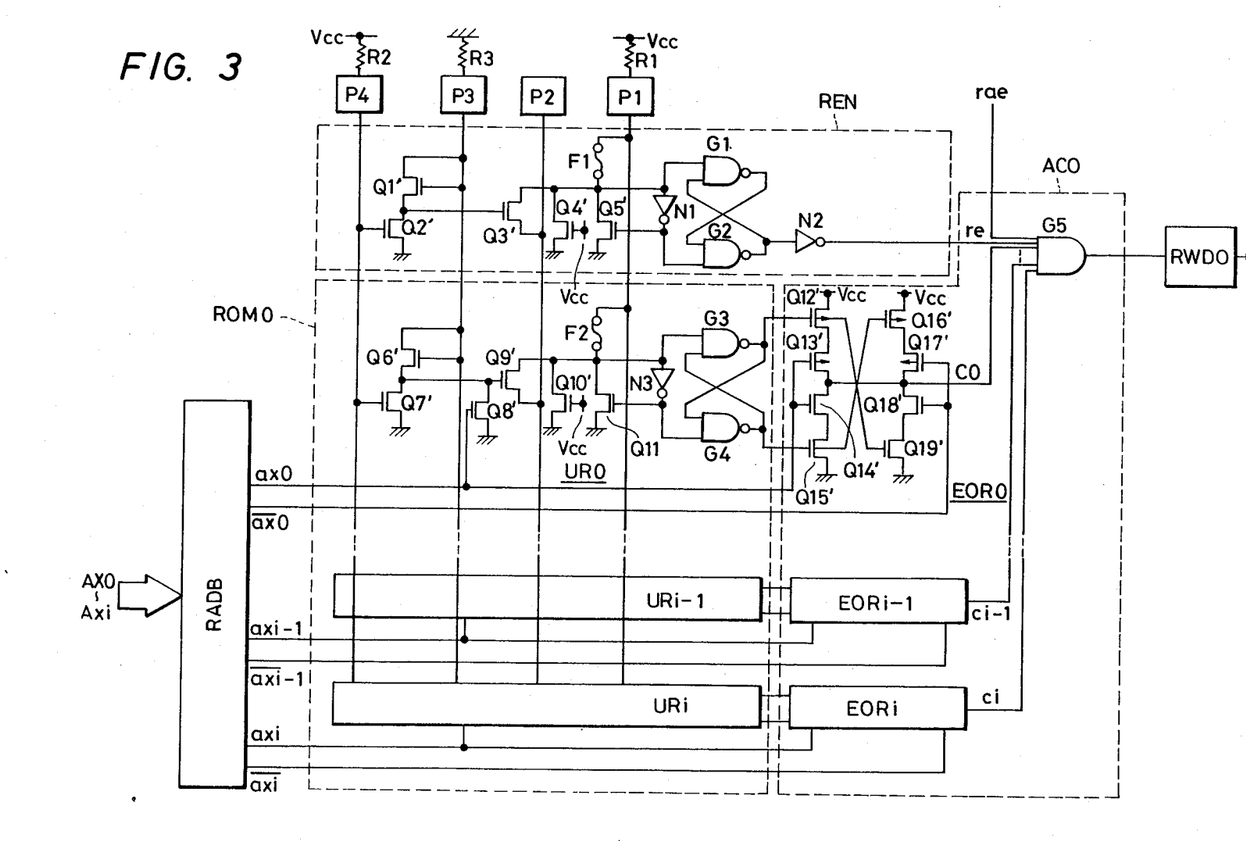
FIG. 3 is a circuit diagram illustrating one embodiment of an enable circuit, a memory circuit of a defective address and an address comparison circuit.

FIG. 3 illustrates one embodiment of the enable circuit REN, the memory circuit ROM0 of the defective address and the address comparison circuit AC0.

The above memory circuit ROM0 of the defective address is formed by unit memory circuits UR0 to URi in accordance with the complementing inner address signals ax0, $\overline{ax0}$ to axi, and $\overline{axi}$. And the above address comparison circuit AC0 is formed by unit address comparison circuits EOR0 to EORi and AND gate circuit G5. Output signals C0 to Ci of the corresponding above unit address comparison circuits EOR0 to EORi and the output signal re of the above enable circuit REN are input into the above AND gate circuit G5. The output signal from the above gate G5 is brought into a high level in the case where the defective address is detected. As a result of this, the stand-by word line driving circuit RWD0 is brought into an actuated state and the level of the signal from stand-by word line Wr0 is brought into the selection state. In this embodiment, inner controlling signal rae is set to be an input signal for the above AND gate circuit G5, and the output signal of the AND gate circuit G5 is, therefore, fixed to a low level by way of bringing this inner controlling signal rae into a low level. Therefore, the AND gate circuit AG1 shown in FIG. 1 is not necessarily individually provided.

Details of the circuit shown in FIG. 3 will now be described.

Terminals P1 to P4 serve as a voltage supply terminal for programming for writing the above irregularly distributed defective address, a power supply voltage Vcc is applied to the terminals P1 and P3 when a predetermined defective address is written, and a grounding potential of the circuit is applied to the terminals P2 and P4.

The above enable circuit is formed by the following circuit elements. Load MOSFET Q1' and driving MOSFET Q2' form an inverter, and a drain gate of load MOSFET Q1' is connected to the terminal P3. The output of the inverter is connected to a gate of driving MOSFET Q3' which acts to cut the fuse F1. A fuse F1 is provided between the drain of MOSFET Q3' and the terminal P1, and the source thereof is connected to the terminal P2. A gate of the above MOSFET Q2' is connected to the terminal P4. Resistance R2 is provided between the above terminal P4 and power supply voltage Vcc. The above fuse F1, although not especially specified, can be made from polysilicon. When a predetermined address is written, power supply voltage Vcc is applied to the terminals P1 and P3, and grounding potential for the circuit is applied to the terminals P2 and P4. As a result of this, the output of the above inverter is brought into a high level, and driving MOSFET Q3' is turned on. The fuse F1 is, therefore, automatically cut.

Resistance of fuse F1 is large (i.e., substantially tens of M$\Omega$) when the fuse F1 is cut, and is hundreds of $\Omega$ when it is not cut. The input signal level of the inverter circuit N1 is determined in accordance with the proportion between the resistance of the fuse F1 and that of MOSFET Q4'. Therefore, when the fuse F1 has been cut, the input level of the inverter circuit N1 is brought into a low level, and when the fuse F1 is not cut, the input level of the inverter circuit F1 is brought into a high level.

In order to judge whether this fuse F1 is cut or not, the following CMOS inverter and a latch circuit are provided.

The latch circuit is formed by way of an intersection connecting the output of CMOS NAND gate circuit G1 and G2 and one input.

The drain output of the above MOSFET Q3' is supplied to the input of CMOS inverter circuit N1 and to an input of NAND gate circuit G2 which is part of the above latch circuit. The output of the above CMOS inverter circuit N1 is supplied to an input of the other NAND gate circuit G1 which is part of the above latch circuit and to the gate of the return MOSFET Q5' which is arranged in a parallel manner to the above driving MOSFET Q3'. The output of the other NAND gate circuit G2 mentioned above is supplied to the input of CMOS inverter circuit N2. The enable signal re is output from the output of this CMOS inverter circuit N2.

Although the output signal of the AND gate circuit G5 is controlled by way of setting the inner controlling signal rae as an input signal to the AND gate circuit G5 in the embodiment shown in FIG. 3, this embodiment is not intended to limit the invention. For example, the inner controlling signal re may be adapted to be made low level at will after cutting the above fuse F1. Specifically, input and output terminals of a MOSFET may be connected in a parallel manner to the above fuse F1 for the purpose of supplying the inner controlling signal rae. The resistance of the fuse F1 can be an equally low value by way of turning on the above parallel-connected MOSFET after cutting the fuse F1 according to this embodiment.

The above unit memory circuit UR0 is formed by MOSFET Q6' or Q11' which are similar to the above enable circuit, CMOS inverter circuit N3 and CMOS NAND gate circuit G3, G4 in the form of a latch. In order to write the above defective address, non-inverted address signal ax0 which is delivered from the address buffer R-ADB is supplied to the gate of MOSFET Q8' which is arranged in the parallel manner as the driving MOSFET Q7' which forms the inverter. In order to write a predetermined defective address, power supply voltage Vcc is, as illustrated above, applied to the terminals P1 and P3, and the grounding potential of the circuit is applied to the terminals P2 and P4. When the above defective address signal ax0 to be written is at a high level, MOSFET Q8' is turned on. As a result of this, the driving MOSFET Q9' which is connected to the fuse F2 is brought into a turning off state, and the fuse F2 is not cut because a cutting current is not conducted to the fuse F2. When the above defective address signal ax0 is low level, MOSFET Q8' is turned off. As a result of this, the driving MOSFET Q9' which is connected to the fuse F2 is turned on, and cutting current is therefore passed to the fuse F2 so as to cut the fuse F2.

In order to judge whether the above fuse F2 is cut or not, CMOS inverter circuit N3 which is similar to the above and its return MOSFET Q11' and NAND gate circuits G3 and G4 which are arranged in the form of a latch are provided.

An address comparison circuit per 1 bit which corresponds to the above defective address is formed by P-channel MOSFET Q12' and 13' arranged in the series form, N-channel MOSFET Q14' and 15', and P-channel MOSFET Q16' and 17' and N-channel MOSFET Q18' and 19'. The junction between MOSFET Q13' and 14' in the above two series MOSFET circuits and the junction between MOSFET Q17' and 18' are commonly connected so as to be an output terminal c0.

Non-inverted address signal ax0 which is output by the address buffer R-ADB is supplied to the gate of MOSFET Q13' and 14' in one of the series MOSFET circuits. Inverted address signal $\overline{ax0}$ is supplied to the gate of MOSFET Q17' and 18' in the other series MOSFET circuit which corresponds to the above.

The defective address signals ax0' and $\overline{ax0'}$ corresponding to the cutting of the fuse F2 are supplied in an intersection manner to the P-channel MOSFET and N-channel MOSFET as that to the residual MOSFET Q12' and Q19' and 15' and Q16' in the above two series MOSFET circuits. A memory circuit and an address comparison circuit which are similar to the above are provided for the residual address signal ax1 to axi in the similar manner.

In the case where address signal ax0 representing the defective address is memorized at the high level (logic "1"), that is, the fuse F2 is not cut, output ax0' from the NAND gate circuit G3 which forms the CMOS latch circuit is brought into the high level, and the output $\overline{ax0'}$ from the NAND gate circuit G4 is brought into the low level. Therefore, N-channel MOSFET Q19' and P-channel MOSFET Q16' of are turned on.

In the case where the address signal ax0 which has been input by means of memory access or refresh mode is low level, P-channel MOSFET Q12' of is turned on, N-channel MOSFET Q18' of is turned on by means of the high level of the inverted address signal $\overline{ax0}$. As mentioned above, in the case where the two address signals are not aligned with each other, output signal c0 of the low level (logic "0") is output by means of the turning on of the above N-channel MOSFET Q18' and 19'.

In the case where the address signal ax0 which has been input by means of the memory access or refresh mode is high level, N-channel MOSFET Q14' is turned on, and P-channel MOSFET Q17' is turned on by means of the low level of the inverted address signal ax0. In the above case where two address signals are not aligned with each other, output signal c0 of the high level (logic "1") is output by means of P-channel MOSFETS Q16' and Q17' which are turned on as mentioned above. And output signal c1 to ci are outlet from the above circuits corresponding to the residual address signals a1 to ai.

The above defective address is detected by means of an output from logical sum circuit G5 to make the stand-by driving circuit RWD0 actuate when the aligning output signal c0 to ci of the above high level (logic "1") and the logic "1" of the enable signal re and logic "1" of the inner controlling signal rae are obtained over all bits of the above address signals.

Figure 4:
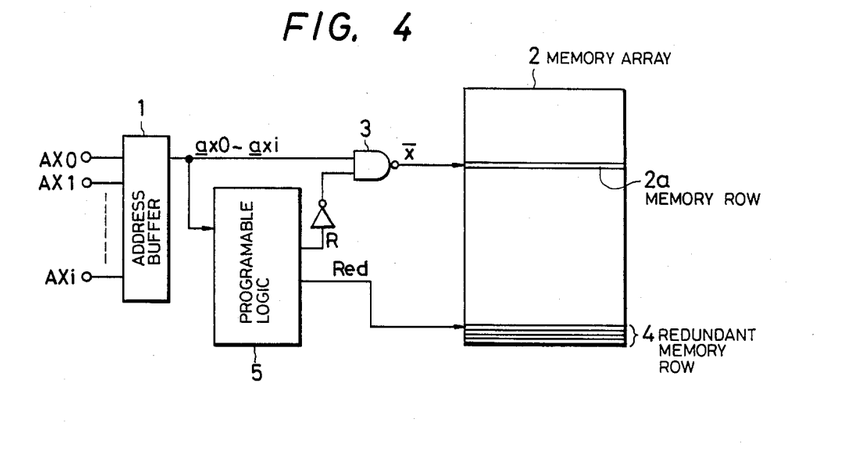
FIG. 4 is a block diagram illustrating one embodiment of a redundant circuit of a semiconductor memory to which the present invention is applied.

A further embodiment of a structure of the redundant circuit of the semiconductor memory to which the present invention is applied is shown in FIG. 4.

In FIG. 4, reference numeral 1 represents an address buffer circuit which forms inner address signals ax0, $\overline{ax0}$ to axi and $\overline{axi}$ in accordance with the address signals AX0 to AXi which are supplied from outside. Reference numeral 2 represents a memory array in which a plurality of memory cells are arranged in the form of a matrix. Reference numeral 3 represents a decoder which forms a selection signal $\overline{X}$ of a corresponding memory row in accordance with the inner address signals ax0, $\overline{ax0}$ to axi and $\overline{axi}$. A plurality of stand-by memory rows are provided adjacent to the memory array.

In this invention, a programmable logic 5 having a fuse of a low resistance which is capable of being cut by a laser is provided, and the above fuse is programmed in accordance with the defective address which has been previously detected in a probe test. The programmable logic 5 is arranged in such a form that when inner address signals ax0, $\overline{ax0}$ to $\overline{axi}$, and aXi are input into the above programmable logic 5, and when a predetermined address (defective address) is input in accordance with the inner address signal, a signal R which prohibits a supply of a selection signal $\overline{X}$ to the regulated memory row 2a is output from the programmable logic 5 to the decoder 3, and a signal Red which selects the corresponding stand-by memory row 4 is output.

Figure 5:
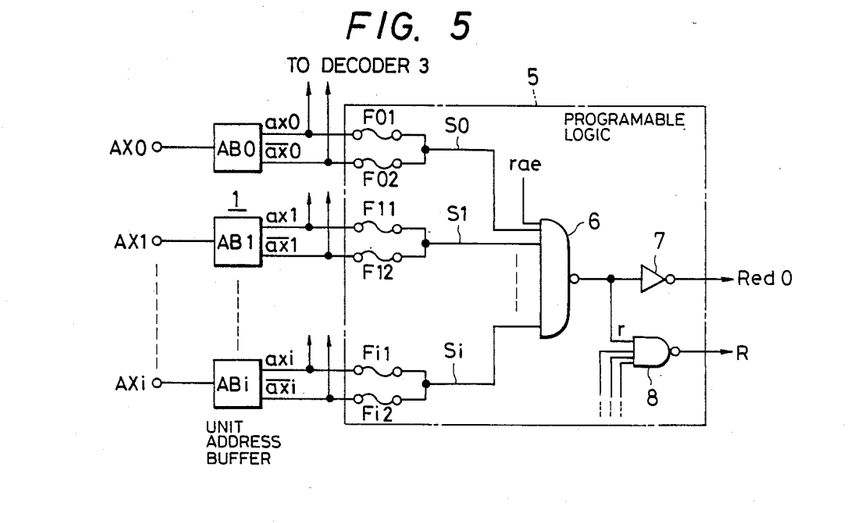
FIG. 5 is a circuit structure illustrating a first embodiment of a programmable logic shown in FIG. 4.

A first embodiment of the above programmable logic 5 is illustrated in FIG. 5.

A pair of fuses F01, F02 to Fi1, Fi2 is provided in accordance with the output signal inner address signals ax0, $\overline{ax0}$ to axi, $\overline{axi}$ in each unit address buffer AB0 to ABi which form the address buffer circuit 1, with one end of the pair of the fuses connected to the output terminal of the address buffer, and the other end commonly connected. By way of connecting this commonly connected terminal to one of the output terminals of the multi-input NAND circuit 6, and connecting one of each pair of fuses F01, F02 to Fi1 and Fi2 by means of a laser, (i.e. cutting one of each pair of fuses with a laser and allowing the other of the pair to remain intact) either one of high level or low level of each unit address buffer output signals ax0, $\overline{ax0}$ to axi and $\overline{axi}$ is thus supplied to the NAND circuit 6.

Therefore, all of the inputs of the NAND circuit 6 can be brought into high level only when a predetermined address (defective address) is input by way of cutting either one of the pair of the fuses in accordance with the defective address which has been previously detected.

The structure of the programmable logic 5 in this embodiment is so formed that an output signal of the NAND circuit 6 which has been inverted by the inverter 7 is supplied as a selection signal Red0 to one of the stand-by memory rows 4.

For example, four selection signals forming logic which comprises the above pairs of fuses F01, F02 to Fi1 and Fi2 and NAND circuit 6 and inverter 7 are provided in accordance with the numbers of the stand-by memory rows which are provided in the memory array portion. The stand-by row selection signals Red0 to Red3 which are output by the above four logic NAND circuit 6 are input into the four-input NAND circuit 8, and its logical product is supplied to the decoder in the formal memory row as a prohibiting signal R for the purpose of prohibiting forming of the selection signal $\overline{X}$. The prohibiting signal R is supplied to the decoder for all of the formal memory row.

As a result of this, high level prohibiting signal R is output when any one output from the above four NAND circuits 6 (only one is illustrated) in the programmable logic 5 is brought into low level. That is, when one of the four stand-by memory rows is selected, the prohibiting signal R of the programmable logic 5 is brought into high level, as a result of which all of forming the selection signal $\overline{X}$ by means of the formal decoder 4 is prohibited. The above fuses F01, F02 to Fi1 and Fi2 may be formed as a conductive layer, such as multicrystal silicon, which is capable of being cut by laser. Further it can be simply formed in an aluminum wiring.

In order to achieve the invention, the inner controlling signal rae is, in this embodiment, adapted to be one of the input singals of NAND circuit 6. Thanks to setting the inner controlling signal rae to low level, the stand-by selection signal Red0 can be set to low level (non-selection level) if the defective address is input into the programmable logic. In this case the prohibiting signal R is brought into low level, and the formal memory row (that is, the defective memory row) can be selected. The address of the defective memory and contents of the defect can be identified because switching to the stand-by memory row can be selectively prohibited, and the defective memory row can be intentionally accessed.

Figure 6:
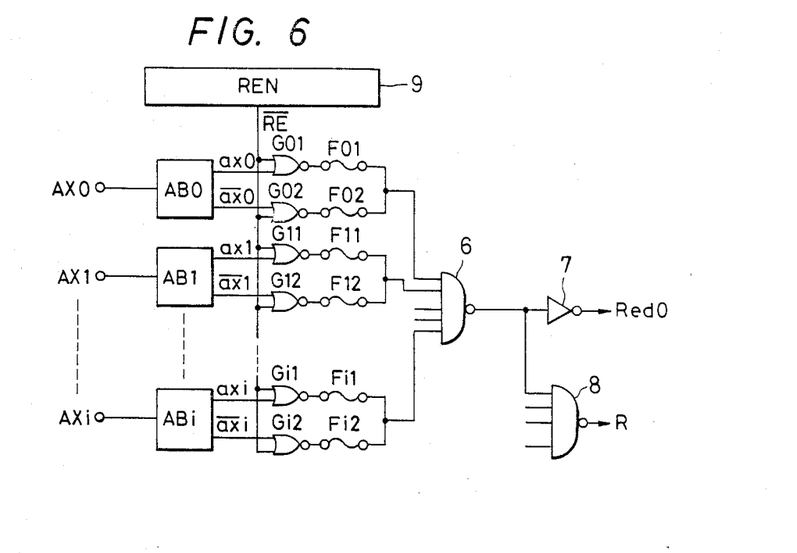
FIG. 6 is a circuit structure illustrating a second embodiment of the programmable logic shown in FIG. 4.

FIG. 6 illustrates a further embodiment of the above embodiment (see FIG. 5).

In the programmable logic 5 in this embodiment, NOR gates G01, G02 to Gi1 and Gi2 are respectively connected between the output terminal of each pair of the unit address buffer AB0, AB1, . . . ABi in the embodiment shown in FIG. 5 and the fuses F01, F02 to Fi1 and Fi2, and inner address signals ax0, $\overline{ax0}$ to axi and $\overline{axi}$ are supplied to either one of the input terminals of each NOR gate, and enable signal $\overline{RE}$ of the redundant enable circuit 9 is supplied to the other input terminal.

The redundant enable circuit 9 comprises, for example, a fuse element which is serially connected between power supply and resistance elements, and which is adapted to output a low level-enable signal $\overline{RE}$ in the case where the fuse is cut, and to output high level-enable signal $\overline{RE}$ in the case where the fuse is not cut. The programmable logic 5 acts in the similar manner as the circuit shown in FIG. 5 when the enable signal $\overline{RE}$ is low level. That is, the selection signal Red0 is output and, also, prohibiting signal R of the formal decoder is output when a defective address is input by way of cutting either one of a pair of fuses F01, F02 to Fi1 and Fi2 in accordance with the defective address which has been previously detected.

In order to achieve this invention, the enable signal $\overline{RE}$ can be optionally brought into high level after the fuse in the redundant enable circuit 9 has been cut in this embodiment. The specific structure of the redundant enable circuit 9 is, for example similar to that of the enable circuit REN shown in FIG. 3.

In the two embodiments mentioned above, since the programmable logic 5 is formed by a fuse which is capable of being cut by laser, and the redundant switch signal (stand-by selection signal Red and prohibiting signal R) is designed to be formed by the programmable logic 5 when a defective address is input, a current inlet circuit for cutting the fuse and a circuit for detecting the state of the pad and fuse for applying the cutting voltage become needless, as a result of which, space of the redundant circuit is greatly reduced. Furthermore, time required for accessing the stand-by row can be shortened in comparison to the conventional redundant circuit of a type of the address comparison method because the redundant switch signal can be generated in accordance with the inner address signal by means of the programmable logic 5.

Furthermore, in the embodiment shown in FIG. 5, since either one of the pair of fuses which is respectively provided for each unit address buffer must be cut to stop the penetrating current, all of the pair of fuses must be cut. On the other hand, in the embodiment shown in FIG. 6, since the fuse is connected to the output terminal of the address buffer through the NOR gate which is controlled by the enable signal, if the pair of fuses are not cut in the no-problem memories, the penetrating current is not passed. Furthermore, complete no-problem products are free from the necessity of the fuse cutting process by way of arranging the redundant enable circuit 9 to output high level-enable signal $\overline{RE}$ when the inner fuse is not cut.

Figure 7:
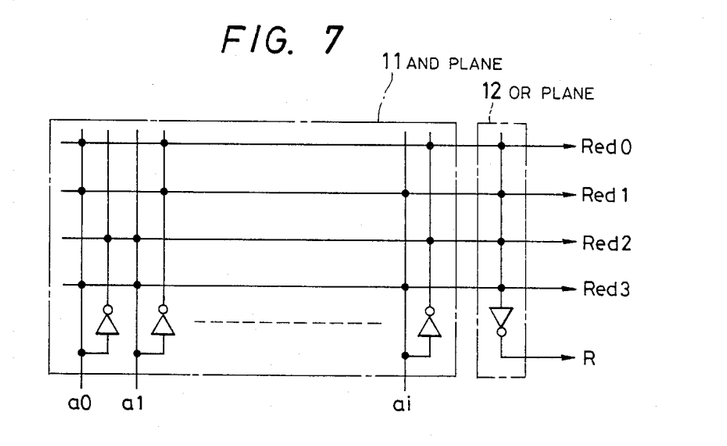
FIG. 7 is a circuit structure illustrating a third embodiment of the programmable logic shown in FIG. 4.

FIG. 7 illustrates another embodiment of the programmable logic 5.

The programmable logic 5 in this embodiment is formed in the similar manner to that the known PLA (Programmable Logic Array). That is, the programmable logic 5 is formed by AND plane 11 which is a logical product of the input ax0 to axi and OR plane 12 which is a logical sum of the output signal in each row in the above AND plane. The AND plane of the above two planes if formed in the manner that it can program by way of cutting or not cutting the fuse. On the other hand, the OR plane is designed in a fixed manner, that is, it is impossible to program because it is a logical sum of the output of all of the rows of the AND plane 11. The logical product output of the address signals ax0 to axi which are outputs of each row of the above AND plane 11 is output as stand-by selection signals Red0 to Red3, and the logical sum output of the output of each row of the OR plane 12 is output as a decode prohibiting signal R to the decoder 3 in the formal memory row.

Figure 8:
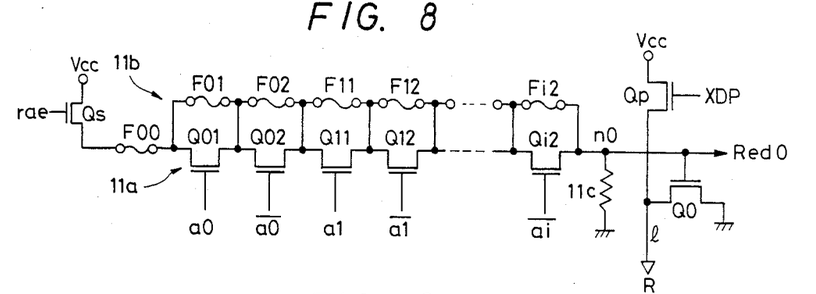
FIG. 8 is another detailed circuit diagram illustrating a partial circuit of the programmable logic shown in FIG. 7.

FIG. 8 illustrates a specific example of the structure of a circuit for a row of the above AND plane 11.

That is, a row of the AND plane 11 is formed by a switch array 11a which is formed by serially connected switches MOSFETS Q01, Q02, Q11, Q12 ... Qi1, Qi2, the numbers of which are two times the number of bits of the address signal, and a fuse array 11b which is formed by a plurality of fuses F01, F02 to Fi1 and Fi2 which are connected between each connection node of the above switches in the manner parallel to the switches.

One end of the above switch array 11a is connected to the power supply voltage Vcc through fuse F00, and the other end thereof is grounded through a resistance 11c. Each fuse which forms the above fuse array 11b is arranged in a pair in accordance with a plurality of pairs of switches to which a complementing signal is applied Q01, Q02 : Q11, Q12 : ... Qi1, Qi2, and either one of the above pair of fuses F01, F02 to Fi1 and Fi2 is designed to be melted in accordance with the defective address which has been previously detected.

As a result of this, only when a predetermined address (defective address) a0 to ai is input into the AND plane 11, all of the switches which form a pair containing the melted fuse are turned on to pass penetrating current from the power supply Vcc to the ground point, and the potential of the output node n0 is therefore brought into high level.

The potential of this output node n0 is applied to the gate terminal of MOSFET Q0 which forms the OR plane. Each drain terminal of the MOSFET Q0 which is provided respectively to a corresponding row of the AND plane 11 is commonly connected to an output signal line l, and the output signal line l is as well connected to power supply Vcc through MOSFET Qp. The MOSFET Qp is turned on by means of a controlling signal XDP when a memory cell is selected.

The output signal line l is therefore modified to low level when the potential of either one output node (for example n0) of rows of the AND plane 11 is brought into high level, and the corresponding MOSFET Q0 is turned on to pass current. A resistance or a loading element which is formed by a depletion type MOSFET can be used as an alternative to the above MOSFET Qp. And a MOSFET may be provided as an alternative to the resistance 11c which is connected to the output node n0 of the AND plane 11 for the purpose of being turned on simultaneously with the MOSFET Qp in the above OR plane 12.

In the case where the memory does not have any defects or a part of the stand-by memory must be used, the fuse F00 adjacent to Vcc in the row which is not used in the AND plane 11 is cut.

In this embodiment, since each fuse F01, F02 to Fi1 and Fi2 are of a type which is capable of being cut by laser, the fuse array 11b in which the current inlet circuit and the pad for applying cutting voltage are needless as shown in FIG. 8.

In order to achieve this invention, in this embodiment, a switch MOSFET Qs is directly provided between the power supply Vcc and the fuse F00. By way of turning off the switch MOSFET Qs, by the signal rae, a formal memory row can be selected without any selection of the stand-by memory row even if the fuse F00 is not cut (when stand-by memory row can be used).

Figure 9:
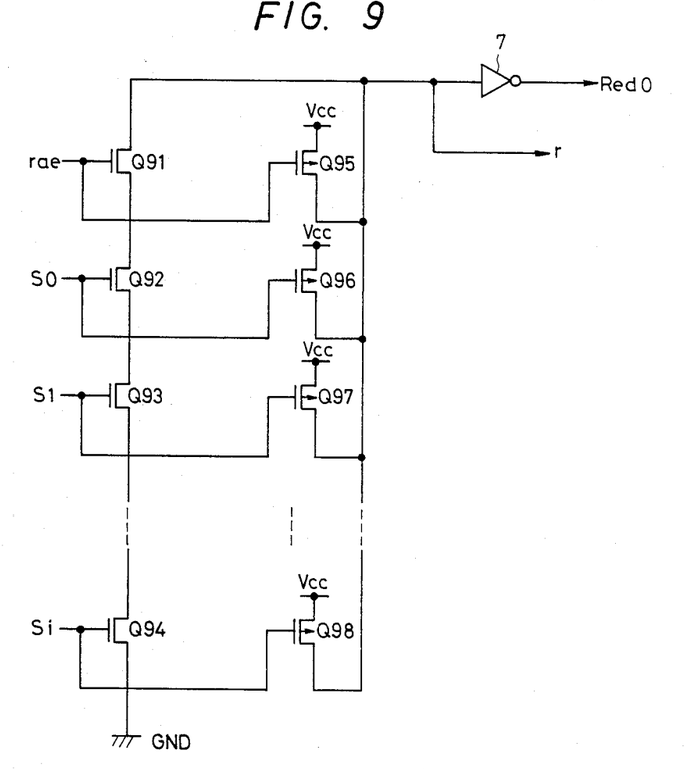
FIG. 9 is a static circuit diagram illustrating one embodiment of the region in a dashed line in the embodiment shown in FIG. 5.

FIG. 9 illustrates one embodiment of the specific circuit of the NAND circuit 6 shown in FIG. 5. N-channel MOSFET Q91 to Q94 are connected between the input terminal of the inverter circuit 7 and the grounding potential of the circuit GND, and P-channel MOSFET Q95 to Q98 are connected in a parallel manner between the input terminal of the inverter circuit 7 and the power supply voltage Vcc. Inner controlling signal rae and input signals S0 to Si are commonly applied to the gate of the respective MOSFET pairs (Q91, Q95), (Q92, Q96), (Q93, Q97), (Q94, Q98). The input signal level of the inverter circuit 7 is brought into high level by way of either one of the signals rae, and S0 to Si being brought into low level. And the input signal level of the inverter circuit 7 is brought into low level by way of all of the signals rae, and S0 to Si being brought into high level.

Figure 10:
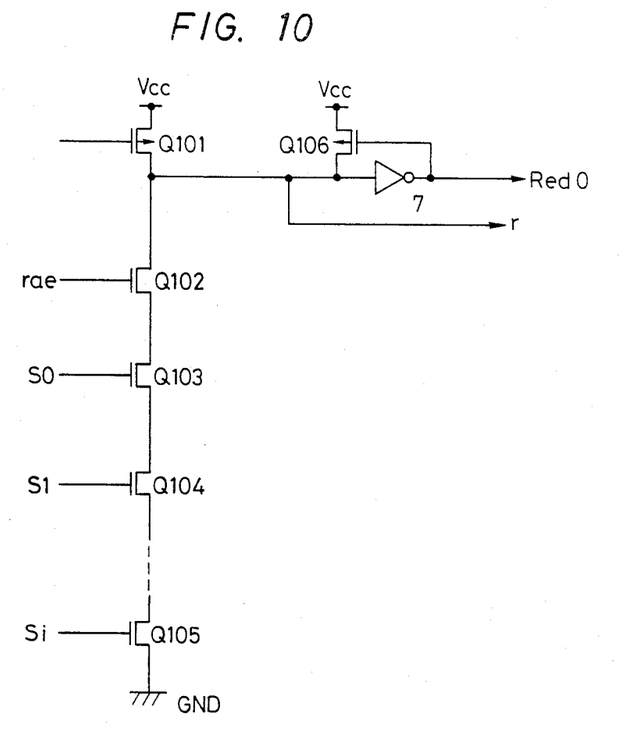
FIG. 10 is a dynamic circuit diagram illustrating one embodiment in the dashed line in the embodiment in FIG. 5.

FIG. 10 specifically illustrates another embodiment of the NAND circuit 6 shown in FIG. 5. MOSFET Q101 for precharge and MOSFET Q102 to Q105 for discharge are directly connected between the power supply voltage Vcc and the ground potential GND. MOSFET Q106 forms a latch circuit in coopration with the inverter circuit 7.

As mentioned above, in the dynamic type RAM, the AND gate circuits AG1 to AG4 are provided between the address comparison circuits AC0 to AC3 of the redundant address switching circuit RAC and corresponding stand-by word line driving circuit RWD0 to RWD3. The output signal from the address comparison circuits AC0 to AC3 is selectively conducted to the corresponding word line driving circuits RWD0 to RWD3 in accordance with the redundant address enable signal $\overline{RAE}$ which is supplied as a controlling signal from outside. As a result of this, switching function of the redundant address switching circuit RAC to the stand-by memory array can be prohibited by way of bringing the redundant address enable signal $\overline{RAE}$ into high level. An operation test on the dynamic type RAM which has been completed can be carried out without any relief of defects. For example, by carrying out a writing and reading test on all of the memory cells, a fail bit map (Fail Bit Map) for the dynamic type RAM can be processed for the purpose of identifying the address of the defective memory cell, and identify the contents of the defects of the memory cell.

As described hereinbefore, the following effects can be obtained by applying this invention to the semiconductor memory such as a dynamic type RAM having a stand-by memory array, that is:

(1) By way of comparing the defective address which is memorized in the defective address memory circuit and the address assigned from outside, and by way of the function of the redundant address switching circuit acting to switch to the stand-by memory array when two addresses are aligned with each other being selectively prohibited in accordance with a predetermined controlling signal which is supplied from outside, the defective memory cell can be intentionally accessed. Therefore the function test and so forth for the semiconductor memory such as a dynamic-type RAM can be carried out after products have been completed without any relief of defects.

(2) By combination of the function test with relief of defects and without relief of defects in a suitable manner, the function test on the semiconductor memory such as a dynamic type RAM can be carried out more efficiently.

(3) By way of the effects (1) and (2), the address of the defective memory cell contained in the semiconductor memory such as a dynamic type RAM and the specific contents of the defect can be identified after the product has been completed.

(4) By way of (1) to (3), statistic research of the state where defects occur and analyzing the contents of the defects of the semiconductor memory such as a dynamic type RAM after completion can be easily carried out.

It is to be understood that the form of my invention herein shown and described is to be taken as a preferred embodiment of the same and that various changes may be resorted to without departing from the spirit of my invention. For example, although the dynamic type RAM in this embodiment is provided with a stand-by memory array in its row address, that is in the word lines, the stand-by memory array may be provided for the column address or for both the word line and the complementing data line. And the memory element, shown in FIG. 1, in the redundant enable circuit REN and address memory circuit of the redundant address switching circuit RAC may be provided with a means to cut a predetermined line by laser and so on as an alternative to the fuse means. Furthermore, the redundant enable circuit REN may be omitted. As an alternative to the arrangement of the redundant address enable signal $\overline{RAE}$ in which this signal is supplied through a respective outer terminal in this embodiment, for example, the way of applying high voltage to the present predetermined outer terminal for an address signal and so forth to make the redundant address enable signal $\overline{RAE}$ may be employed. In FIG. 1, although the output signal of the address comparison circuits AC0 to AC3 is input to the AND gate circuits AG1 to AG4, and is selectively conducted to the stand-by word line driving circuits RWD0 to RWD3 in accordance with redundant address enable signal $\overline{RAE}$, whereby the switching function of the redundant address switch circuit RAC is prohibitted, the inner controlling signal re which is supplied by the redundant enable circuit REN may be selectively conducted to the address comparison circuits AC0 to AC3 by means of the redundant address enable signal $\overline{RAE}$. Furthermore, for example, an address roll call function and so forth in which the output signal of the address comparison circuits AC0 to AC3 is output through a predetermined outer terminal may be provided for the structure of the redundant address switching circuit RAC shown in FIG. 1. And the structure of the blocks of the dynamic type RAM shown in FIG. 2 may be varied, for example, the memory array may be formed by a plurality of memory mats or writing and read out of the memory data may be carried out in units of a plurality of bits and so forth.

What is claimed is:

1. A semiconductor memory comprising:
    a first selection line coupled to a first memory cell and a second selection line coupled to a second memory cell;
    a selection means which selects either one of said selection lines, said selection means having a selection circuit which optionally selects said first selection line or said second selection line when an address signal corresponding to said first selection line is aligned with a predetermined address signal;
    a memory means for memorizing said predetermined address signal; and
    means for detecting an alignment of said address signal with said predetermined address signal,
    wherein said first selection line is a word line to which a primary memory cell is connected, and said second selection line is a word line to which a stand-by memory cell is connected so that said first memory cell is said primary memory cell and said second memory cell is said stand-by memory cell, and further wherein said predetermined address signal is an address signal which corresponds to a word line to which a defective memory cell is connected.

2. A semiconductor memory according to claim 1, further comprising an input terminal through which a signal for controlling said selection circuit is provided.

3. A semiconductor memory according to claim 2, wherein said memory means comprises a read only memory.

4. A semiconductor memory according to claim 3, wherein said read only memory comprises a plurality of fuses which are programmed with said predetermined address signal in accordance with whether the respective fuses are in an open or closed condition.

5. A semiconductor memory according to claim 4, wherein said read only memory includes a circuit for cutting said fuses by passing a predetermined current therethrough for programming said read only memory.

6. A semiconductor memory according to claim 5, wherein said fuses are programmed by laser cutting.

7. A semiconductor memory comprising:
    a memory array having a plurality of memory cells respectively arranged along predetermined lines in accordance with predetermined addresses;
    a spare memory array having a plurality of spare memory cells arranged along predetermined spare lines;
    a redundant address switching circuit including means for storing the addresses of known defective memory cells in said memory array, means for comparing an address signal from outside said semiconductor memory with said stored addresses, and means for switching said address signal from outside said semiconductor memory to one of said predetermined spare lines in said spare memory array; and
    means for overriding the switching means in said redundant address switching circuit to permit access to said known defective memory cell in said memory array by an address signal from outside said semiconductor memory.

8. A semiconductor memory according to claim 7, wherein said overriding means comprises a gate means for receiving an output of the comparator means and for receiving a control signal, wherein said gate means includes means for only allowing said switching means to operate to switch to said predetermined spare line of said spare memory array if said comparing means indicates that the address signal received from outside said semiconductor memory corresponds to the stored address of a defective memory cell and if said control signal has a predetermined level.

9. A semiconductor memory according to claim 8, wherein said address storing means comprises a read only memory.

10. A semiconductor memory according to claim 9, wherein said read only memory comprises a plurality of fuses which are programmed with the known address of a defective memory cell in said memory array in accordance with whether the respective fuses are in an open or closed condition.

11. A semiconductor memory according to claim 10, wherein said read only memory includes a circuit for cutting said fuses by passing a predetermined current therethrough for programming said read only memory.

12. A semiconductor memory according to claim 10, wherein said fuses are programmed by laser cutting.

13. A semiconductor memory according to claim 7, wherein said address storing means comprises a read only memory.

14. A semiconductor memory according to claim 13, wherein said read only memory comprises a plurality of fuses which are programmed with the known address of a defective memory cell in said memory array in accordance with whether the respective fuses are in an open or closed condition.

15. A semiconductor memory according to claim 14, wherein said read only memory includes a circuit for cutting said fuses by passing a predetermined current therethrough for programming said read only memory.

16. A semiconductor memory according to claim 14, wherein said fuses are programmed by laser cutting.

17. A semiconductor memory comprising:
a memory array having a plurality of memory cells and a plurality of selecting lines coupled to said memory cells, respectively;
a spare memory array having a spare memory cell and a spare selecting line coupled to said spare memory cell;
an address terminal means for receiving an address signal;
selecting means for selecting one of said selecting lines in accordance with an address signal received at said address terminal means;
storing means for storing an address of a known defective memory cell in said memory array;
detecting means for detecting an agreement between the address signal received at said address terminal and the address stored in said storing means;
setting means coupled to said detecting means, for setting an output signal from said detecting means to a predetermined level in accordance with a control signal to override the detecting operation of said detecting means; and
inhibiting means coupled between said selecting means and said setting means, for inhibiting the selecting operation of said selecting means in accordance with said predetermined level of said output signal from said detecting means.

18. A semiconductor memory according to claim 17, wherein said setting means sets the output signal from said detecting means to said predetermined level when said detecting means detects the agreement so that said defective memory cell is tested.

19. A semiconductor memory according to claim 18, further comprising a control terminal means for receiving the control signal.

20. A semiconductor memory according to claim 19, wherein said address storing means comprises a read only memory.

21. A semiconductor memory according to claim 20, wherein said read only memory comprises a plurality of fuses which are programmed with the known address of a defective memory cell in said memory array in accordance with whether the respective fuses are in an open or closed condition.

22. A semiconductor memory according to claim 21, wherein said read only memory includes a circuit for cutting said fuses by passing a predetermined current therethrough for programming said read only memory.

23. A semiconductor memory according to claim 21, wherein said fuses are programmed by laser cutting.

* * * * *